(12) United States Patent
Scher et al.

(10) Patent No.: US 7,731,932 B2
(45) Date of Patent: Jun. 8, 2010

(54) METHODS OF PROCESSING NANOCRYSTALS, AND COMPOSITIONS, DEVICES AND SYSTEMS INCLUDING SAME

(75) Inventors: Erik C. Scher, San Francisco, CA (US); Mihai A. Buretea, San Francisco, CA (US); Jeffery A. Whiteford, Belmont, CA (US); Andreas P. Meisel, Redwood City, CA (US)

(73) Assignee: Nanosys, Inc., Palo Alto, CA (US)

( * ) Notice: Subject to any disclaimer, the term of this patent is extended or adjusted under 35 U.S.C. 154(b) by 0 days.

(21) Appl. No.: 12/185,444

(22) Filed: Aug. 4, 2008

(65) Prior Publication Data

US 2008/0308130 A1     Dec. 18, 2008

Related U.S. Application Data

(60) Division of application No. 10/933,827, filed on Sep. 2, 2004, now Pat. No. 7,422,790, and a continuation-in-part of application No. 10/656,802, filed on Sep. 4, 2003, now Pat. No. 6,878,871, and a continuation-in-part of application No. 10/656,910, filed on Sep. 4, 2003, now Pat. No. 6,949,206.

(60) Provisional application No. 60/544,285, filed on Feb. 11, 2004.

(51) Int. Cl.
  *C01B 19/00* (2006.01)
  *C01B 19/04* (2006.01)

(52) U.S. Cl. .................. 423/508; 423/509; 423/511; 423/561.1; 423/566.1; 977/700; 977/773; 977/775; 977/811; 977/814; 977/815; 977/824

(58) Field of Classification Search .................. 423/508, 423/509, 511, 561.1, 566.1; 977/700, 773, 977/775, 811, 814, 815, 824
See application file for complete search history.

(56) References Cited

U.S. PATENT DOCUMENTS

| 6,207,229 B1 | 3/2001 | Bawendi et al. |
| 6,225,198 B1 | 5/2001 | Alivisatos et al. |
| 6,251,303 B1 | 6/2001 | Bawendi et al. |
| 6,306,736 B1 | 10/2001 | Alivisatos et al. |
| 6,322,901 B1 | 11/2001 | Bawendi et al. |
| 6,326,144 B1 | 12/2001 | Bawendi et al. |
| 6,440,213 B1 | 8/2002 | Alivisatos et al. |

(Continued)

FOREIGN PATENT DOCUMENTS

WO     03081683     10/2003

OTHER PUBLICATIONS

Colvin. V.L. et al. "Light-emitting diodes made from cadmium selenide nanocrystals and a semiconducting polymer" Nature (1994) 370:354-357.

(Continued)

*Primary Examiner*—Timothy C Vanoy
(74) *Attorney, Agent, or Firm*—Donna M. Fabian; Andrew L. Filler

(57) ABSTRACT

Methods of processing nanocrystals to remove excess free and bound organic material and particularly surfactants used during the synthesis process, and resulting nanocrystal compositions, devices and systems that are physically, electrically and chemically integratable into an end application.

47 Claims, 6 Drawing Sheets

U.S. PATENT DOCUMENTS

| | | | |
|---|---|---|---|
| 6,607,829 | B1 | 8/2003 | Bawendi et al. |
| 6,617,583 | B1 | 9/2003 | Bawendi et al. |
| 7,422,790 | B1 * | 9/2008 | Scher et al. .............. 428/411.1 |
| 2003/0136943 | A1 | 7/2003 | Alivisatos et al. |
| 2004/0095658 | A1 | 5/2004 | Buretea et al. |
| 2004/0118448 | A1 | 6/2004 | Scher et al. |
| 2004/0178390 | A1 | 9/2004 | Whiteford et al. |
| 2006/0115640 | A1 * | 6/2006 | Yodh et al. ................. 428/221 |

OTHER PUBLICATIONS

Duan, X et al., "High-performance thin-film transistors using emiconductor nanowires and nanoribbons" Nature (2003) 425:274-278.

Ginger, D.S. e al., "Charge Separation in Conjugated-Polymer/Nanocrystal Blends" Synthetic Metals (1999) 101:425-428.

Ginger, D.S. et al., "Charge Injection and Transport in Fils of CdSe Nanocrystals" J. Appl. Phys. (2000) 87 (3):1361-1368.

Greenham, N.C. et al., "Charge Separation and Transport in Conjugated-Polymer/Semiconductor-Nanocrystal Composites Studied by Photoluminescence Quenching and Photoconductivity" Phys. Rev. B. (1996) 54 (24):17628-17637.

Huynh, W.U. et al., "CdSe Nanocrystal Rods/Poly(3-hexylthiophene) Composite Photovoltaic Devices," Adv. Mater. (1999) 11(11):923-927.

Manna, L. et al., "Synthesis of soluble and processable rod-, arrow-, teardrop-, and tetrapod-shaped CdSe nanocrystals" J. Am. Chem. Soc. (2000) 122(51):12700-12706.

Manna, L. et al., "Epitaxial growth and photochemical annealing of graded CdS/ZnS shells on colloidal Cd/Se nanorods" J. Am. Chem. Soc. (2002) 124(24):7136-7145.

Peng, X. et al., "Shape control of CdSe nanocrystals" Nature (2000) 404(6773):59-61.

Puntes et al., "Colloidal nanocrystal shape and size control: the case of cobalt" Science (2001) 291:2115-2117.

Rockenberger et al., "A new nonhydrolytic single-precursor approach to surfactant-capped nanocrystals of transition metal oxides" J. Am. Chem. Soc. (1999) 121:11595-11596.

Steigerwald, M.L. et al. "Surface derivatization and isolation of semiconductor cluster molecules" J. Amer. Chem. Soc. (1988) 110:3046-3050.

* cited by examiner

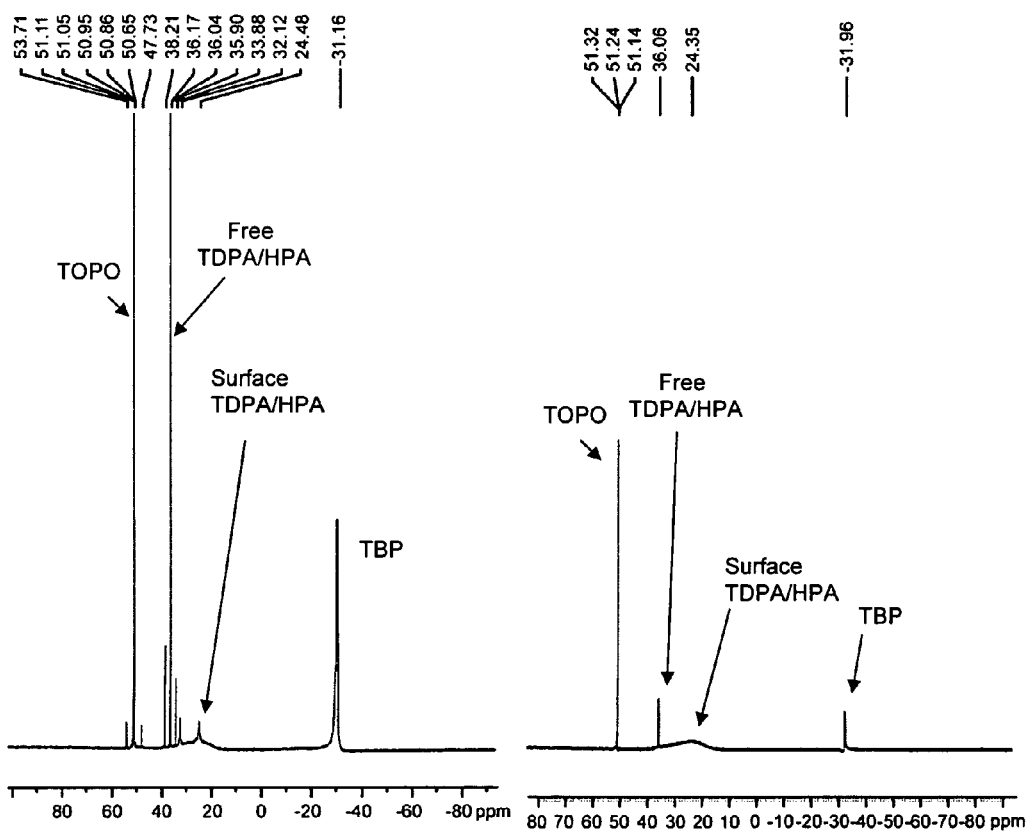
Figure 3A                    Figure 3B

METHODS OF PROCESSING NANOCRYSTALS, AND COMPOSITIONS, DEVICES AND SYSTEMS INCLUDING SAME

CROSS REFERENCE TO RELATED APPLICATIONS

This application is a divisional of U.S. patent application Ser. No. 10/933,827, filed Sep. 2, 2004, U.S. Pat. No. 7,422,790, which is a non-provisional utility patent application claiming priority to and benefit of the following prior provisional patent application: U.S. patent application No. 60/544,285, filed Feb. 11, 2004, entitled "Methods of processing nanocrystals, compositions, devices and systems including same" by Scher et al.; U.S. patent application Ser. No. 10/656,910, filed Sep. 4, 2003, entitled "Nanostructure and nanocomposite based compositions and photovoltaic devices" by Scher et al., now U.S. Pat. No. 6,949,206; and U.S. patent application Ser. No. 10/656,802, filed Sep. 4, 2003, entitled "Organic species that facilitate charge transfer to or from nanostructures" by Whiteford et al., now U.S. Pat. No. 6,878,871, the full disclosures of which are hereby incorporated herein by reference in their entirety for all purposes.

FIELD OF THE INVENTION

The invention is in the field of nanostructures. In particular, the invention relates to methods of processing nanocrystals and to compositions, devices, and systems including such processed nanocrystals.

BACKGROUND OF THE INVENTION

The world of "Nanotechnology" has been simultaneously heralded by some who view its advances as providing the next great technological evolution and derided by others who view it as just the latest buzz-word technology to attract venture capital investment. While their fundamental views on the promise of the technology are at odds, members of both camps will point to a number of common issues that nanotechnology must address if it is ever to fulfill its promises.

Of particular note is that, while both camps tend to acknowledge that nanomaterials often have unique and potentially valuable properties, e.g., structural, electrical, opto-electrical and thermoelectric, the ability of scientists and eventually users or consumers to access these unique and valuable properties can present a substantial hurdle to realizing the full benefits of these materials.

For example, while nanowire based electronic circuits may present potentially wide ranging benefits to the electronics industry, interfacing with these materials to produce such new and improved circuits has not met with great success, with a few notable exceptions: see, e.g., Duan et al., Nature 425:274-278 (2003). In the case of nanowire electronics, the inability to access the advantages of the nanomaterial is largely physical, as the material's dimensions are so small that making actual physical or electrical contact, in a robust repeatable manufacturing process, becomes substantially more difficult.

Relatedly, despite extremely promising theoretical energy conversion efficiencies, previously described nanomaterial based photovoltaic devices have not achieved anything close to the expected efficiencies, largely due to an inability to successfully and completely integrate such materials into photovoltaic cells to access the converted energy. In this case, the inability to access the properties of the material is believed to be, at least in part, a chemical issue, involving both the surface of the nanomaterials through which access is desired, and the ability of the nanomaterials to efficiently function in their particular composite environment.

Whether a function of electrical connectability, or chemical integration of nanomaterials, it will be appreciated that there is a need for processes that produce more readily integrated nanocrystal populations, as well as the nanocrystal populations themselves. The present invention meets these and a variety of other needs.

BRIEF SUMMARY OF THE INVENTION

The present invention generally relates to methods of processing nanocrystals more completely in order to improve the efficiency of, inter alia, the electronic and physical interaction between the nanocrystals and their surroundings. For example, the invention provides methods of processing nanocrystals that can be used to remove excess levels of free and/or bound surfactant from the nanocrystals. Compositions incorporating such processed nanocrystals are also a feature of the invention.

A first general class of embodiments provides methods of processing nanocrystals. In the methods, the nanocrystals are provided in a first solvent in which they are soluble. The nanocrystals have a total amount of surfactant associated therewith, the total amount of surfactant including an amount of free surfactant and an amount of nanocrystal bound surfactant. The nanocrystals are precipitated by adding a second solvent of higher polarity to the first solvent, producing a precipitating solvent mixture in which the nanocrystals are insoluble, to provide precipitated nanocrystals. The precipitated nanocrystals are separated from the precipitating solvent mixture and are then redissolved by addition of a third solvent in which they are soluble. The surfactant is typically soluble in at least the second solvent and the precipitating solvent mixture.

The precipitating, separating and redissolving steps are optionally repeated, e.g., for a selected number of iterations and/or until the nanocrystals reach a desired level of purity. For example, the precipitating, separating and redissolving steps can be repeated two or more, 3 or more, 4 or more, 5 or more, or even 6 or more times. As another example, the precipitating, separating and redissolving steps can be repeated until the amount of free surfactant associated with the nanocrystals is less than 5%, less than 1%, less than 0.5%, or even less than 0.1% of the total amount of surfactant associated with the nanocrystals. In certain embodiments, the nanocrystals are checked following at least one of the redissolving steps to determine the amount of free surfactant remaining associated with the nanocrystals.

In certain embodiments, the first solvent comprises a single solvent; in alternative embodiments, it includes a mixture of a polar and a less polar solvent. Typically, the polar solvent is identical to the second solvent. The polar solvent can be essentially any suitable polar solvent, including, but not limited to, an alcohol (e.g., methanol or ethanol), an acetate (e.g., ethyl acetate), or a ketone (e.g., acetone). In one class of embodiments, the polar solvent is an alcohol having at least two carbon atoms (e.g., isopropanol or butanol). Similarly, the less polar solvent can be essentially any suitable solvent, including, but not limited to, chloroform, toluene, an alkane (e.g., hexanes), and benzene. Typically, a ratio of less polar solvent to polar solvent in the first solvent is between about 3:1 and about 10:1 (volume:volume). For example, the ratio of less polar solvent to polar solvent in the first solvent is typically greater than 3:1, greater than 4:1, or about 4:1. Similarly, a ratio of less polar solvent to more polar solvent (i.e., second solvent plus polar solvent included in the first solvent) in the precipitating solvent mixture is typically between about 2:1 and about 1:2 (volume:volume). For example, the ratio of less polar solvent to more polar solvent in the precipitating solvent mixture can be 2:1 or less, e.g., 1:1 or less.

Typically, a ratio of the first solvent to the second solvent in the precipitating solvent mixture is between about 2:1 and about 1:2 (volume:volume). For example, in one class of embodiments, the ratio of the first solvent to the second solvent in the precipitating solvent is 2:1 or less (e.g., 1:1 or less).

The first solvent can be essentially any non-polar or relatively non-polar solvent. Suitable first solvents include, but are not limited to, chloroform, toluene, an alkane (e.g., hexanes), and benzene. Similarly, the second solvent can be essentially any polar or relatively polar solvent. Suitable first solvents include, but are not limited to, an alcohol (e.g., methanol, or preferably an alcohol having at least two carbon atoms, e.g., ethanol, isopropanol, and butanol), an acetate (e.g., ethyl acetate), and a ketone (e.g., acetone). The third solvent can, but need not be, identical to the first solvent.

Another general class of embodiments provides methods of removing excess bound surfactant from nanocrystals. In the methods, a solution containing nanocrystals dissolved therein is provided. The nanocrystals have a total amount of surfactant associated therewith, the total amount of surfactant including an amount of free surfactant and an amount of bound surfactant. The amount of free surfactant in the solution is less than 10% of the total amount of surfactant (e.g., less than 5%, 1%, or 0.1% the total amount of surfactant). A base is added to the nanocrystals, which base forms an insoluble salt with the bound surfactant. The insoluble salt is separated from the nanocrystals dissolved in the solution, to provide nanocrystals having from a partial monolayer to a bilayer of surfactant bound thereto.

The insoluble salt can be separated from the nanocrystals dissolved in the solution, for example, by centrifuging the nanocrystals and insoluble salt and decanting the nanocrystals dissolved in the solution from a pellet of insoluble salt.

A variety of suitable bases are known in the art. Examples include, but are not limited to, pyridine, aniline, bypyridine, piperidine, imidazole, diethylamine, triethylamine, and di-isopropylamine. The base is typically added at a ratio of base to nanocrystal solution of greater than 1:1 (volume:volume); e.g., greater than 2:1, or even greater than 3:1.

Yet another general class of embodiments provides methods of processing nanocrystals. In the methods, the nanocrystals are provided in a first mixture in which the nanocrystals are soluble. The first mixture includes a first solvent and/or a reaction mixture in which the nanocrystals were synthesized. The nanocrystals are precipitated by adding a second solvent to the first mixture to provide a second mixture in which the nanocrystals are insoluble to provide precipitated nanocrystals, which are then separated from the second mixture. The precipitated nanocrystals are redissolved by addition of at least the first solvent, to provide a third mixture. The polarity of the third mixture is adjusted to provide a fourth mixture in which the nanocrystals are insoluble, to provide precipitated nanocrystals. The precipitated nanocrystals are separated from the fourth mixture. The redissolution, precipitation, and separation steps are repeated until, when the nanocrystals are redissolved in the first solvent, an amount of free surfactant is less than 5% an amount of total surfactant, the amount of total surfactant comprising the amount of free surfactant and an amount of nanocrystal bound surfactant. Preferably, the redissolution, precipitation, and separation steps are repeated until the amount of free surfactant is less than 1%, less than 0.5%, or more preferably, less than 0.1% the amount of total surfactant. For example, the redissolution, precipitation, and separation steps can be repeated two or more, three or more, four or more, five or more, or even six or more times. In certain embodiments, the nanocrystals are checked following at least one of the redissolving steps to determine the amount of free surfactant.

In some embodiments, the first mixture includes only the first solvent and/or the reaction mixture, while in other embodiments, the first mixture also includes the second solvent. Similarly, the nanocrystals can be redissolved by addition of the first solvent to the precipitated nanocrystals to provide the third mixture, or by addition of the first solvent and the second solvent. As for the embodiments described above, the ratio of the first solvent to the second solvent in the first and/or third mixture is typically between about 3:1 and about 10:1 (volume:volume), while the ratio of the first solvent to the second solvent in the second and/or fourth mixture is typically between about 2:1 and about 1:2. The polarity of the third mixture is typically adjusted by adding the second solvent to the third mixture, but, in embodiments in which the third mixture includes the first and second solvents, the polarity of the third mixture can be adjusted by removal of at least a portion of the first solvent (e.g., by evaporation). The first solvent is typically less polar than the second solvent (although, in embodiments in which the nanocrystals have a high enough level of solubilizing surfactant associated with them to make them more soluble in more polar rather than less polar solvents, the first solvent can be more polar than the second).

As described for the above embodiments, a number of suitable first and second solvents are known in the art. For example, the first solvent can be chloroform, toluene, an alkane (e.g., hexanes), or benzene, while the second solvent can be an alcohol (e.g., methanol, or preferably an alcohol having at least two carbon atoms, e.g., ethanol, isopropanol, or butanol), an acetate (e.g., ethyl acetate), or a ketone (e.g., acetone).

Another general class of embodiments provides methods of processing nanocrystals. In the methods, a solvent mixture including a first solvent in which the nanostructures are soluble and a second solvent in which the nanostructures are not soluble is added to the nanostructures. The nanostructures are precipitated by addition of an additional quantity of the second solvent, the additional quantity being sufficient to precipitate the nanostructures from the solvent mixture. The nanostructures are then separated from the solvent mixture (e.g., by centrifugation), thereby removing excess organic surfactant (which remains in the solvent mixture) from the nanostructures. The addition, precipitation, and separation steps are optionally repeated two or more times (e.g., 3 or more, 4 or more, 5 or more, or 6 or more times). The nanostructures can be analyzed to determine a quantity of surfactant present, e.g., before precipitation, after separation and redissolution, after each cycle of precipitation and redissolution, or after a prescribed number of cycles. The addition, precipitation, and separation steps are optionally repeated until the quantity of surfactant present reaches a desired amount (e.g., until an amount of free surfactant is less than 10%, 5%, 1%, or 0.1% of a total amount of surfactant, or the like).

As for the embodiments above, a number of first and second solvents can be selected. For example, the first solvent can comprise toluene or chloroform, and the second solvent can comprise an alcohol comprising more than two carbon atoms (e.g., isopropanol) or an acetate (e.g., ethyl acetate).

The solvent mixture added to the nanostructures typically comprises the first solvent and the second solvent in a ratio between 1:1 and 10:1. As one specific example, the solvent mixture added to the nanostructures can comprise four parts toluene to one part isopropanol.

The methods optionally include additional purification steps, e.g., to remove even more of the excess surfactant. For example, a pyridine exchange can be performed, and the resulting organic salts can be precipitated (and removed, e.g., after centrifugation) while leaving the nanostructures in solution.

Yet another general class of embodiments provides methods of processing nanocrystals. In the methods, the nanocrystals are combined with a first solvent in which the nanocrystals are soluble and a second solvent in which the nanocrystals are less soluble (e.g., insoluble). The first and second solvents are permitted to form a first liquid phase comprising the first solvent and the nanocrystals and a second liquid phase comprising the second solvent, and the phases are then separated. Since the surfactant is typically soluble in both the first and second solvents (and is preferably more soluble in the second solvent than are the nanocrystals, and more preferably is also itself more soluble in the second solvent than in the first), this process results in a reduction in the amount of free surfactant in solution with the nanocrystals.

This process is optionally repeated to yield a desired level of purity. Such repeated processing may be carried out a selected number of iterations, e.g., as are known to yield the desired purity. For example, the steps can be repeated two or more, three or more, four or more, five or more, or even six or more times. In certain preferred aspects, the dissolved nanocrystals are checked for purity, e.g., to determine whether the surfactant level in the composition is sufficiently low. The combination, phase formation, and separation steps are then optionally repeated as necessary until the amount of free surfactant in the nanocrystal mixture is less than 10% or less than 5% of the total surfactant concentration (free and bound), preferably less than 1%, and more preferably less than 0.1% of the total amount of surfactant.

The first and second solvents, as well as their relative ratios, will typically vary depending upon the nature of the nanocrystals and the organic contaminant that is sought to be removed, e.g., the type of surfactant(s) present. Typically, for cleaning of inorganic nanocrystals, the first solvent will be less polar than the second solvent. In one specific example embodiment, nanocrystals prepared with TOP as the surfactant are processed with toluene as the first solvent and methanol as the second solvent.

Nanocrystals processed by any of the methods described herein (e.g., nanocrystals lacking excess free and/or bound surfactant) form another feature of the invention, as do compositions, systems, and devices including such processed nanocrystals. Thus, one general class of embodiments provides a composition including a population of nanocrystals dissolved in a first solvent. The nanocrystals are associated with a total amount of surfactant, which includes an amount of bound surfactant and an amount of free surfactant in solution. The amount of free surfactant is less than about 5%, preferably less than about 1%, less than about 0.5%, and more preferably less than about 0.1% of the total amount of surfactant. As noted previously, the nanocrystals can be of essentially any shape, size, and/or composition.

A related general class of embodiments provides a composition comprising a population of nanocrystals having a surfactant bound thereto dissolved in a first solvent. The nanocrystals comprise less than a bilayer of surfactant associated therewith. Preferably, the nanocrystals comprise about a monolayer or less of surfactant associated therewith.

Another related general class of embodiments provides a composition including a population of nanocrystals and a surfactant bound thereto, wherein the surfactant comprises less than a bilayer. For example, the surfactant preferably comprises about a monolayer or less.

As noted, nanocrystals processed by the methods of the invention are optionally incorporated into various compositions and devices. Thus, one example class of embodiments provides a composite that comprises an organic polymer matrix and a population of nanocrystals disposed within the organic polymer matrix. The nanocrystals have a surfactant associated therewith, the surfactant comprising less than a bilayer (e.g., the surfactant can comprise about a monolayer or less).

Another class of embodiments provides a composition comprising a first population of nanocrystals and a second population of nanocrystals. The first population of nanocrystals has a surfactant associated therewith, the surfactant comprising less than a bilayer (e.g., about a monolayer or less). The second population of nanocrystals has a composition different from the first population of nanocrystals, and is interspersed with the first population in the composition. The second population optionally also comprises less than a bilayer of the same or different surfactant. The interspersed first and second nanocrystal populations can, but need not be, disposed within a matrix, e.g., an organic polymer matrix.

BRIEF DESCRIPTION OF THE DRAWINGS

FIGS. 3A-3G are $^{31}$P-NMR spectra of nanocrystal preparations following different washing and processing steps, showing the level of free and bound surfactant associated with those nanocrystal preparations. As shown, each successive washing step significantly reduces the amount of free surfactant (sharp peak) relative to the amount of bound surfactant (broad hump). FIG. 3A shows the amount of free surfactant versus bound surfactant following a single washing step; FIG. 3B shows the amount of free surfactant versus bound surfactant following two washing steps; FIG. 3C shows the amount of free surfactant versus bound surfactant following three washing steps; FIG. 3D shows the amount of free surfactant versus bound surfactant following four washing steps; FIG. 3E shows the amount of free surfactant versus bound surfactant following five washing steps; FIG. 3F shows the amount of free surfactant versus bound surfactant following six washing steps; and FIG. 3G shows enlarged views of the bound surfactant peaks from FIG. 3D (top), FIG. 3E (middle), and FIG. 3F (bottom).

DEFINITIONS

Figure 1:
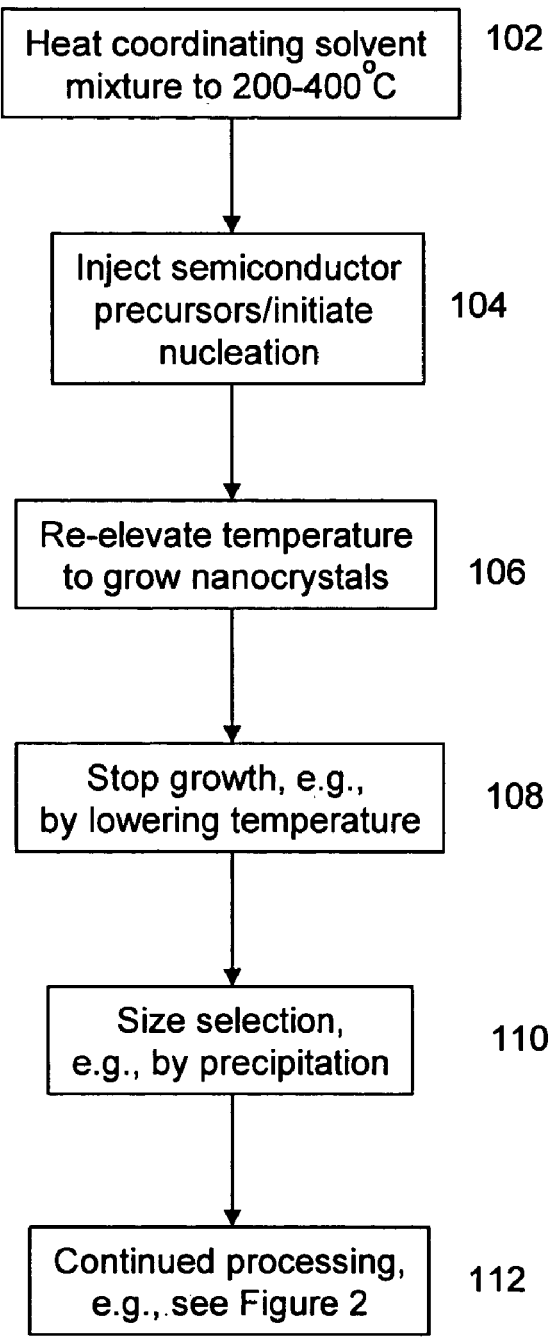
FIG. 1 is a flow chart that schematically illustrates nanocrystal synthesis using a surfactant mediated synthesis process.

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in the practice for testing of the present invention, the preferred materials and methods are described herein.

Accordingly, the terminology used herein is for the purpose of describing particular embodiments only, and is not intended to be limiting.

As used in this specification and the appended claims, the singular forms "a," "an" and "the" include plural referents unless the context clearly dictates otherwise. Thus, for example, reference to "a nanostructure" includes a plurality of nanostructures, reference to "a solvent" includes mixtures of solvents, reference to "a surfactant" includes mixtures of surfactants, and the like.

The term "about" as used herein indicates the value of a given quantity varies by +/−10% of the value, or optionally +/−5% of the value, or in some embodiments, by +/−1% of the value so described.

The terms "crystalline" or "substantially crystalline", when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

A "nanostructure" is a structure having at least one region or characteristic dimension with a dimension of less than about 500 nm, e.g., less than about 200 nm, less than about 100 nm, less than about 50 nm, or even less than about 20 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, quantum dots, nanoparticles, and the like. Nanostructures can be, e.g., substantially crystalline, substantially monocrystalline, polycrystalline, amorphous, or a combination thereof. In one aspect, each of the three dimensions of the nanostructure has a dimension of less than about 500 nm, e.g., less than about 200 nm, less than about 100 nm, less than about 50 nm, or even less than about 20 nm.

A "nanocrystal" is a nanostructure that is substantially monocrystalline. A nanocrystal thus has at least one region or characteristic dimension with a dimension of less than about 500 nm, e.g., less than about 200 nm, less than about 100 nm, less than about 50 nm, or even less than about 20 nm. Nanocrystals can be substantially homogeneous in material properties, or in certain embodiments can be heterogeneous (e.g. heterostructures). The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. The nanocrystals can be fabricated from essentially any convenient material or materials. For example, the nanocrystals can comprise an inorganic material, a semiconducting material (e.g., a Group II-VI, III-V, or IV semiconductor), a metal, a semi-metal, a conductive material, an insulating material, and/or the like. In one aspect, each of the three dimensions of the nanocrystal has a dimension of less than about 500 nm, e.g., less than about 200 nm, less than about 100 nm, less than about 50 nm, or even less than about 20 nm. Examples of nanocrystals include, but are not limited to, substantially spherical nanocrystals, branched nanocrystals, and substantially monocrystalline nanowires, nanorods, nanodots, quantum dots, nanotetrapods, tripods, bipods, and branched tetrapods (e.g., inorganic dendrimers).

A "branched nanocrystal" is a nanocrystal having three or more arms, where each arm has the characteristics of a nanorod, or a nanocrystal having two or more arms, each arm having the characteristics of a nanorod and emanating from a central region that has a crystal structure distinct from that of the arms. Examples include, but are not limited to, bipods, tripods, and nanotetrapods (tetrapods).

A "nanotetrapod" is a generally tetrahedral branched nanostructure having four arms emanating from a central region or core, where the angle between any two arms is approximately 109.5 degrees. Typically, the core has one crystal structure and the arms have another crystal structure. (It is worth noting that this does not prevent the nanotetrapod from being monocrystalline, since the arms and the core are related by a stacking fault; for example, a core with a zinc blende structure and an arm with a wurtzite structure are related by a stacking fault that does not disrupt the tetrahedral bonding of the two constituent atoms of the nanostructure.)

A "substantially spherical nanocrystal" is a nanocrystal with an aspect ratio between about 0.8 and about 1.2.

An "aspect ratio" is the length of a first axis of a nanostructure divided by the average of the lengths of the second and third axes of the nanostructure, where the second and third axes are the two axes whose lengths are most nearly equal each other. For example, the aspect ratio for a perfect rod would be the length of its long axis divided by the diameter of a cross-section perpendicular to (normal to) the long axis.

A "nanorod" is a nanostructure that has one principle axis that is longer than the other two principle axes. Consequently, the nanorod has an aspect ratio greater than one. Nanorods of this invention typically have an aspect ratio between about 1.5 and about 10, but can have an aspect ratio greater than about 10, greater than about 20, greater than about 50, or greater than about 100, or even greater than about 10,000. Longer nanorods (e.g., those with an aspect ratio greater than about 10) are sometimes referred to as nanowires. The diameter of a nanorod is typically less than about 500 nm, preferably less than about 200 nm, more preferably less than about 150 nm, and most preferably less than about 100 nm, about 50 nm, or about 25 nm, or even less than about 10 nm or about 5 nm. Nanorods can have a variable diameter or can have a substantially uniform diameter, that is, a diameter that shows a variance less than about 20% (e.g., less than about 10%, less than about 5%, or less than about 1%) over the region of greatest variability. Nanorods are typically substantially crystalline and/or substantially monocrystalline, but can be, e.g., polycrystalline or amorphous.

A "surfactant" is a molecule capable of interacting (whether weakly or strongly) with one or more surfaces, faces, or the like of a nanostructure. One or more surfactants are typically employed in nanostructure synthesis reactions to aid in size and/or shape control of the resulting nanostructures, to suppress aggregation and maintain solubility of the nanostructures, and/or the like.

A "total amount of surfactant associated with" nanocrystals, e.g., with a population of nanocrystals in solution, includes an amount of free surfactant and an amount of bound surfactant. "Bound surfactant" or "nanocrystal bound surfactant" is physically associated with the nanocrystals (e.g., covalently or non-covalently associated with a nanostructure surface, or covalently or non-covalently associated with a molecule that is itself covalently or non-covalently associated with the nanostructure surface). "Free surfactant" is not bound to the nanocrystals.

A "solvent" is a liquid substance capable of dissolving other substances. The relative polarity of any two solvents can be compared, for example, by comparing their polarity indices (see, e.g., CRC Handbook of Chemistry and Physics, 84$^{th}$ ed., CRC Press).

The term "matrix" as used herein refers to a material, often a polymeric material, into which a second material (e.g., a nanocrystalline composition) is embedded or surrounded. The matrix can be a conductive composition, a semiconductive composition, or a non-conductive composition.

A variety of additional terms are defined or otherwise characterized herein.

DETAILED DESCRIPTION

I. General Description of the Invention

The present invention is generally directed to methods of processing nanocrystal populations, and to nanocrystal composites and compositions that result from such processes, which populations of nanocrystals and nanocrystal composites provide enhanced performance characteristics, by virtue of their having been more completely processed and/or as a result of being more readily integratable into their ultimate application. The nanocrystals processed in accordance with the methods described herein are, e.g., then readily integrated into matrices including organic polymer matrices, matrices that include other nanocrystals of the same or differing composition, sol-gel matrices, ceramic matrices, inorganic matrices, and the like.

As noted previously, one of the constant difficulties associated with truly exploiting the beneficial properties of nanomaterials has been the ability to effectively integrate those materials into their ultimate application. On a purely structural basis, positioning and orientation of nanomaterials must be practiced either on a bulk basis, or using self alignment, positioning or alignment techniques that exploit, e.g., chemical, energetic or magnetic properties of the nanomaterials. For other applications where structural integration is not as critical, e.g., in bulk applications of nanomaterials, issues of integration still may be prominent. For example, where one is utilizing nanomaterials as a bulk material, but exploiting their optical or electrical properties, it may be critical that one has properly integrated those materials into whatever matrix or upon whatever substrate is selected as optimal for a given application. Such proper integration can make the difference between efficiently exploiting the properties of the nanomaterials and wasting those properties.

In at least one example, it is believed that the extraction of electrical energy, e.g., in the form of separated charges, from nanomaterials is significantly impacted by the chemical integration of the nanomaterials with their surroundings into which the electrical energy is to be transported. Of particular interest is the transfer of charge into or out of the nanocrystals from or to a charge conducting matrix, as used in nanocrystal based opto-electrical devices such as photovoltaics. In particular, nanocrystals have been used and proposed for use as charge separation components for a number of applications, including photovoltaic devices. Briefly, when light impinges upon a nanocrystal, it has the effect of creating an electron hole pair or "exciton" within the crystal. When allowed to recombine within the crystal, the exciton emits light of a wavelength that is characteristic of the size and composition of the crystal. However, when the electron (or hole) is successfully extracted from the crystal and conducted to one of a pair of opposing electrodes, an electrical potential is created that can be exploited.

This property is the fundamental basis for the use of nanocrystal compositions in the next generation of photovoltaic cells. Specifically, because of the ability to provide these materials in flexible composites, potential to inexpensively manufacture such composites, relative high theoretical conversion efficiencies of such materials, and tunability of these materials, there is an expectation that nanocrystal based photovoltaic devices may revolutionize energy generation.

Despite the expectations and early successes for photovoltaics utilizing nanocrystals as the active component, there exists substantial room for improvement, e.g., to achieve near the theoretical efficiencies. Without being bound to a particular theory of operation, it is believed that at least a portion of the efficiency losses seen to date in prototype systems stems from poor connection of one of the charge carriers, e.g., an electron conducting nanocrystal component, to the other charge carrier, e.g., a hole conducting surrounding matrix, whether that be an organic conducting polymer matrix or adjacent nanocrystals of a different composition. It is believed that this poor connection results in incomplete charge extraction and separation from the nanocrystals, which, in turn, is believed to be at least one cause of the lower than theoretical efficiencies.

Accordingly, in at least one aspect, the invention provides for the processing of the nanocrystals to remove excess levels of contaminating materials that interfere with this connection. One example of such a contaminant includes the surfactants that are used in the synthesis of the nanocrystals and/or that are used to improve the handling characteristics of the nanocrystals, e.g., their solubility. In particular, without being bound to a particular theory of operation, it is believed that the above-mentioned surfactants provide a barrier layer that interferes with charge transfer between the nanocrystal component and its surrounding matrix. Unfortunately, however, some level of surfactant is required in order to provide for reasonable handling of the nanocrystal component. Specifically, if the nanocrystal is insufficiently coated with surfactant, then it will aggregate with other nanocrystals rather than yielding good dispersion in its ultimate matrix, which will lead to inefficient charge extraction and even non-functioning composites. As a result, it is a goal of the present invention to provide a nanocrystal population that possesses sufficient surfactant coating to permit the solubility of the nanocrystal, but not so much that it excessively interferes with charge extraction from the nanocrystal. As used herein, the concept of solubility as it is applied to nanocrystal populations generally envisions nanocrystals that are able to exist in solution in a substantially non-aggregated state, e.g., over 70%, 80% or 90% of the nanocrystals in a given population are not aggregated with any other nanocrystals in the same population, preferably greater than 95% are non-aggregated, and more preferably greater than 99% are non-aggregated. Again without being bound to a particular theory of operation, it is believed that such coating requires the presence of sufficient surfactant to provide from a partial monolayer on the nanocrystals to upwards of a bi-layer or even multilayer of surfactant coating a nanocrystal.

Thus, in at least one aspect, the present invention provides methods and resulting compositions for processing nanocrystal populations to remove excess organic materials, and particularly the surfactants used in producing or solubilizing those populations of nanocrystals, so as to provide good interaction between the nanocrystals in the population and their surroundings, both in terms of charge extraction and physical interactions, e.g., solubility. For ease of discussion, the exemplary system is described in terms of a population of nanocrystals disposed in a matrix, e.g., a conducting polymer matrix, to form a composite material. However, it will be readily appreciated that the invention has broad applicability to situations where it is desired to improve the interaction between nanocrystals and whatever material surrounds them, including e.g., other nanocrystals, aqueous materials, solids, e.g., substrates, insulators, or the like. For example, it will be readily appreciated that a wide variety of opto-electronic and/or luminescent applications of nanocrystals operate on the same fundamental principles of charge injection or extraction that would benefit from enhanced charge transfer between matrix and nanocrystal, e.g., nanocrystal based LEDs, etc.

In general, the present invention provides methods for reducing the level of excess surfactant in a nanocrystal population by one or both of removing excess unbound surfactant from the mixture that includes the nanocrystals, and removing excess levels of surfactant that may be physically associated with the nanocrystals, which is generally referred to herein as "bound" surfactant despite the nature of the association. By way of example, "bound" surfactant, as used herein, includes covalent attachment, but also includes non-covalent associations, such as van der Waals, hydrophobic/hydrophilic interactions, and the like. In general, the goals of the invention are achieved, respectively, by a process of washing the nanocrystal population to remove excess unbound or free surfactant, and stripping the resultant nanocrystals of excess associated bound surfactant using an exchange or titration process.

While prior researchers have discussed washing procedures for processing nanocrystals (see, e.g., Huynh et al., Adv. Mater. 11(11):923-927 (1999); and Greenham, et al., Phys. Rev. B 54(24):17628-17635 (1996)), such procedures have resulted in nanocrystals that have relatively high levels of contaminating surfactant, both bound and free. Without being bound to a particular theory of operation, it is believed that this excess level of contamination is at least partially responsible for the lackluster performance of electrical or opto-electrical devices based upon these materials, relative to their theoretical potentials. Further, these earlier references specifically disclose the necessity of avoiding additional washing steps by suggesting that further washing steps will reduce the solubility of the overall nanocrystal component, and thus reduce its integratability. Additionally, while discussing washing procedures, by and large, such washing has simply focused upon washing and rewashing precipitated nanocrystals to remove any residual free materials from those precipitated crystals, which iterative washing and rewashing processes tend to re-precipitate and re-suspend the same contaminants.

However, contrary to the teachings of these early publications, it is an object of the invention specifically to provide further processed nanocrystals, and particularly nanocrystal populations that have less contaminating organic material, e.g., surfactant, than those described previously. Such nanocrystal populations provide improved performance characteristics due in part, it is believed, to the removal of excess interfering components. Further, despite the removal of such excess surfactant, these nanocrystal populations retain the requisite solubility to be processible into the desired devices, applications or systems.

Accordingly, in a first aspect, the present invention provides processes for the removal of excess levels of free surfactant that is present in a solution of nanocrystals through the iterative washing of the nanocrystal component that involves repeated selective precipitation and redissolution of the nanocrystals. By removal of excess levels of free surfactant is meant that of the resulting overall surfactant composition of a solution of nanocrystals, the free component is less than 10%, and preferably less than 5%, more preferably less than 1%, and in some cases, preferably less than about 0.1%, of the overall surfactant present. Similarly, the resulting nanocrystal compositions are readily incorporated into composites for use in a variety of applications, e.g., in organic polymer matrices, mixed nanocrystal matrices, sol-gel matrices, and the like.

Figures 3C, 3D:
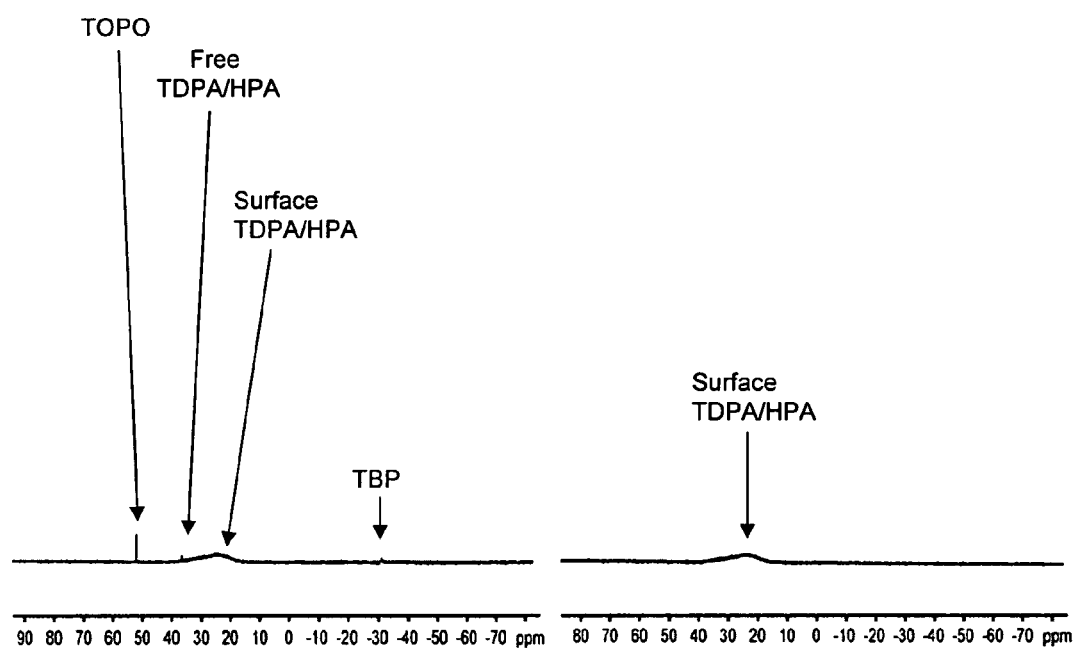
Figure 3E:
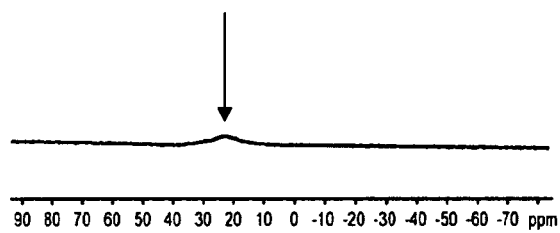
Figure 3F:
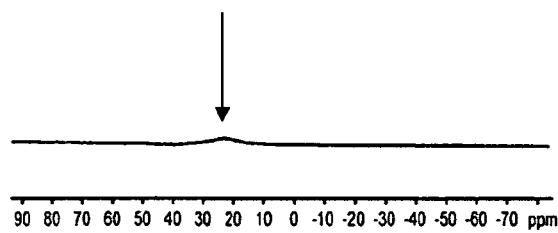
Figure 3G:
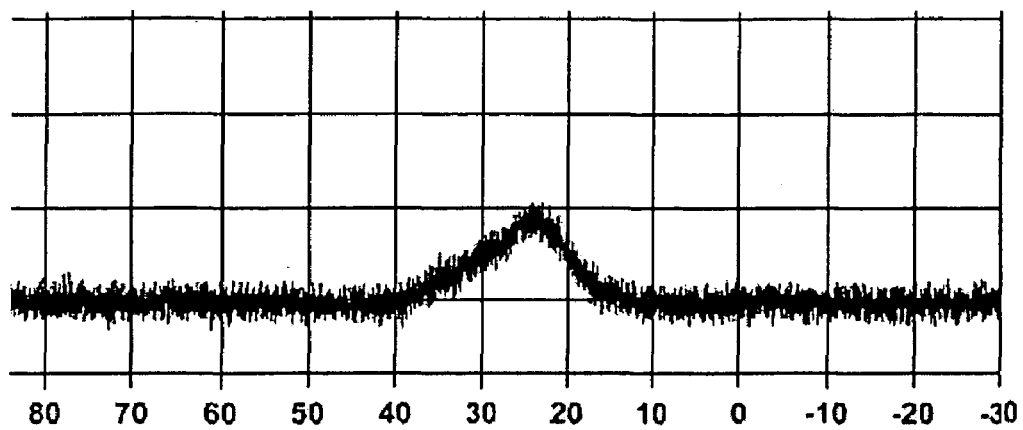
Figure 3G:
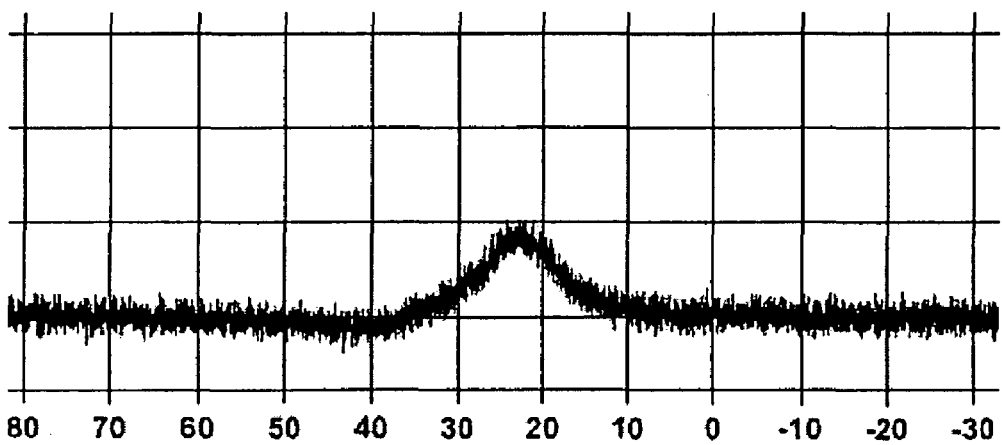
Figure 3G:
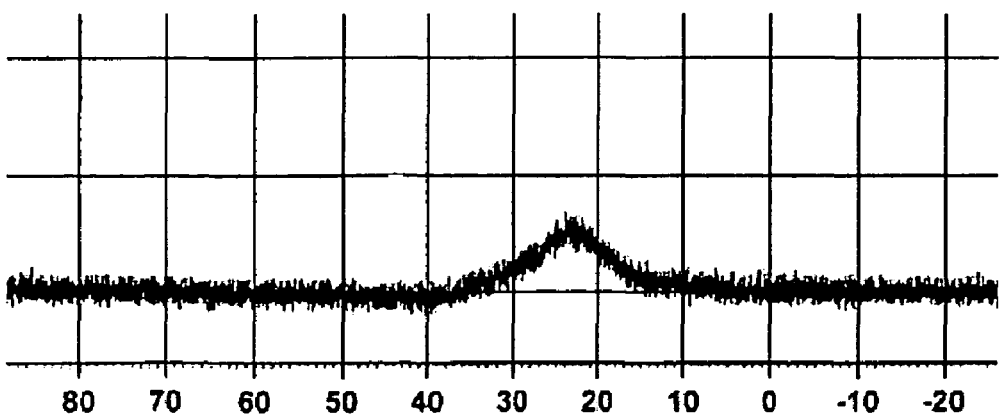

Determination of the amount of free and bound surfactant can be carried out by a number of methods, with $^{31}$P-NMR being particularly preferred for, e.g., phosphorous containing surfactants. In particular, FIGS. 3A-3G show a series of plots of iterative washing steps for CdSe nanorod populations using the methods set forth herein. As shown, each successive washing step significantly reduces the amount of free surfactant (sharp peak) relative to the amount of bound surfactant (broad hump). Following four washing steps, the amount of free surfactant is virtually undetectable in the nanocrystal containing solution (See FIG. 3D). Additional washing steps, e.g., washes 5 and 6, also begin to further reduce the level of bound surfactant as indicated by the slight flattening of the broad peak (FIGS. 3E, 3F and 3G). The relative amounts of free and bound surfactant can be determined, for example, by comparing the areas under the respective peaks in the NMR plots.

As noted previously, reduction of the amount of free surfactant in the nanocrystal containing solution, and thus, of the amount incorporated into any resulting device, film or system, is optionally carried out by an iterative washing process that involves selectively precipitating out the nanocrystal portion of the solution away from a majority of the contaminating free surfactant, redissolving the nanocrystals, and repeating the precipitation and redissolving steps until the level of free surfactant in solution is reduced to a desired level.

In a second aspect of the invention, the nanocrystal population, e.g., that which has been washed to remove excess free surfactant, is subject to additional processing steps to reduce the level of bound surfactant associated therewith. As noted above, it is generally desirable to reduce the level of bound surfactant to approximately one or two monolayers on the surface of the crystal. Typically, this includes from about a partial monolayer up to about a bilayer of surfactant. As with the washing steps above, this is generally carried out by a process of precipitation and centrifugation, although in this aspect of the invention, it is the excess surfactant that is selectively precipitated away from the nanocrystals.

II. Nanocrystal Synthesis

Semiconductor nanocrystals, their synthesis and their applications have previously been described in great detail. See, e.g., U.S. Pat. Nos. 6,322,901, 6,207,229, 6,607,829, 6,617,583, 6,326,144, 6,225,198, and 6,306,736 (each of which is hereby incorporated herein by reference in its entirety for all purposes). See also U.S. Patent Application 60/591,987, entitled "Process for group III-V semiconductor nanostructure synthesis and compositions made using same" by Scher et al. As used herein, semiconductor nanocrystals include a wide range of different materials that exist as nanoparticles, e.g., having at least one cross sectional dimension of less than about 500 nm, and preferably, less than 100 nm. These nanocrystals may be comprised of a wide range of semiconductive materials, including for example, group III-V, group II-VI and group IV semiconductors or alloys of these materials. Nanocrystals may be substantially spherical in shape, e.g., as in quantum dots, or they may be elongated, as in nanorods or nanowires, e.g., having length to width ratios of 2, 5, 10 or even 20 or more, or may comprise branched structures, e.g., as in nanotetrapods. See, e.g., U.S. Pat. No. 6,322,901; Peng et al, Nature 404(6773):59-61 (2000); Manna et al., J. Am. Chem. Soc. 122(51):12700-12706 (2000); Manna et al., J. Am. Chem. Soc. 124(24):7136-7145 (2002); and Duan et al., Nature, 425:274-278 (2003), each of which is incorporated herein by reference in its entirety for all purposes.

Such nanocrystals may comprise a single homogeneous composition or may comprise heterostructures, e.g., core-shell architectures where the core material is a first composition and the shell material is a second, different material that interfaces with the first at a defined boundary or gradient. Additionally, the nanocrystals in a population may be of variable size, or they may be monodisperse in terms of one or more of their cross-sectional dimensions. Likewise, a population of nanocrystals may comprise a single type of nanocrystal, e.g., where substantially every member of the population is of a similar make-up, e.g., homo or heterostructure, or the population may be a heterogeneous mixture of different crystal types.

In a number of cases, valuable nanocrystals are fabricated using solution based processes that rely upon surfactant mediated growth to produce nanocrystals of a desired shape and size, e.g., nanorods or branched nanostructures, e.g., nanotetrapods. Such surfactant mediated syntheses have been described in substantial detail in, e.g., Peng et al, Nature 404(6773):59-61 (2000), Manna et al., J. Am. Chem. Soc. 122(51):12700-12706 (2000), and Manna et al., J. Am. Chem. Soc. 124(24):7136-7145 (2002). FIG. 1 provides a flow chart that schematically illustrates the steps of an exemplary nanocrystal synthesis process.

Briefly, and as shown in FIG. 1, semiconductor nanocrystals are typically synthesized by introducing semiconductor precursors (104), e.g., a Group II precursor and a Group VI precursor (or, as another example, Group III and V precursors), into a high temperature binary or coordinating solvent mixture (102), e.g., that has a boiling point above a temperature at which the precursors will react, e.g., between 200 and 400° C. (104). Typically, such binary solvent mixture includes at least two organic surfactants. Such surfactants typically include, e.g., tri-octyl phosphine oxide (TOPO), hexyl phosphonic acid (HPA) and tetradecylphosphonic acid (TDPA); and TOPO and octadecylphosphonic acid (ODPA) or hexadecylphosphonic acid (HDPA). Injection of the precursors into the hot reaction solvent mixture results in a short burst of homogeneous nucleation of nanocrystals (104). The rapid reduction of reagents associated with the nucleation, as well as the drop in temperature as a result of the addition of reagents, effectively stops nucleation. Heating of the reaction mixture (106) then permits annealing and growth of nanocrystallites, e.g., as a substantially monodisperse particle size population. The growth process is then stopped by reducing the temperature of the reaction mixture (108). Further refining of size distribution of the particles may optionally be accomplished by size selective precipitation (110) of the nanocrystals from the solvent mixture (see, e.g., U.S. Pat. No. 6,322,901) using, e.g., low molecular weight alcohols, e.g., during one of the subsequent processing steps described below, to change the polarity of the reaction mixture and thus precipitate out nanocrystals. The resulting nanocrystals are then subject to further processing (112).

Synthesis of other types of nanocrystals is also known in the art. See, e.g., Rockenberger et al. (1999) "A new nonhydrolytic single-precursor approach to surfactant-capped nanocrystals of transition metal oxides" J Am Chem Soc 121:11595-11596, and Puntes et al. (2001) "Colloidal nanocrystal shape and size control: The case of cobalt" Science 291:2115-2117.

III. Nanocrystal Processing

A. Predetermined Purity of Reagents

In at least some instances, the relative purity of the nanocrystal populations will be dictated, at least in part, by the relative purity of the materials used in such processing. In particular, although the surfactants and other solvents used in the crystal synthesis processes are indicated to be of a particular purity, such purity is often inaccurate. As such, it is often useful to predetermine the purity of the reagents involved in the processing, in order to assure that pure crystal preparations result. In at least one aspect, it is useful to ensure that the surfactants used in crystal synthesis are at least 99% pure, and preferably greater than 99% pure, e.g., as measured by NMR. In the event that the surfactants as received from the supplier are not at the desired level of purity, then purification steps, e.g., washing, recrystallization, sublimation, distillation, etc. may be used to provide the desired level of purity. In many cases, such surfactants contain oxidized product, starting material reactants and by products of incomplete ester hydrolysis. For example, phosphonic acids, particularly ODPA and TDPA, are highly susceptible to this problem as they are often received with equivalent levels of ester present, along with HCl and other impurities. The ester form of the phosphonic acid can cause significant problems since it is able to oligomerize into multidentate structures, making cleaning of the resulting nanocrystals particularly difficult. Likewise, TOPO often includes both phosphonic and phosphinic acids that can lead to variations in reaction rates and acid:metal ratios during synthesis.

B. Reduction of Free Surfactant

As mentioned repeatedly herein, the typical synthesis processes for nanocrystals, e.g., those described above, generally result in nanocrystal populations having relatively large amounts of contaminating material, e.g., organic surfactants, associated therewith. Standard precipitation based methods for recovering the nanocrystals from the synthetic reaction mixture can be ineffective at removing such excess contaminants. In particular, a number of the surfactants routinely used in such syntheses are often insoluble (or poorly soluble) in the precipitating solvents, thus co-precipitating with the nanocrystals. In fact, even after some level of further purification and processing, such organic contaminants have still remained part of the compositions that have been previously described in the art, e.g., having free surfactant that exceeds 1 or 5 or 10% and bound surfactant that far exceeds the partial monolayer to bilayer of surfactant that would be desired. Additionally or alternatively, previously described methods of nanocrystal purification stopped short of the sufficient number of washing iterations necessary to yield the desired level of purity. Although primarily described in terms of surfactants used during nanocrystal synthesis, it will be appreciated that the surfactant component that is sought to be removed may include the organic surfactants employed during crystal synthesis, e.g., a high temperature tolerant organic surfactant, e.g., TOPO, or it may include an exogenously introduced surfactant (also termed a "ligand") that is added to the nanocrystals, e.g., exchanged with or in addition to the surfactants used during synthesis, in order to promote the integratability of the nanocrystal (solubility, electrical integration, etc). Examples of this latter type of surfactant are described in, e.g., U.S. patent application Ser. No. 10/656,910, filed Sep. 4, 2003, previously incorporated herein by reference in its entirety for all purposes.

Figure 2:
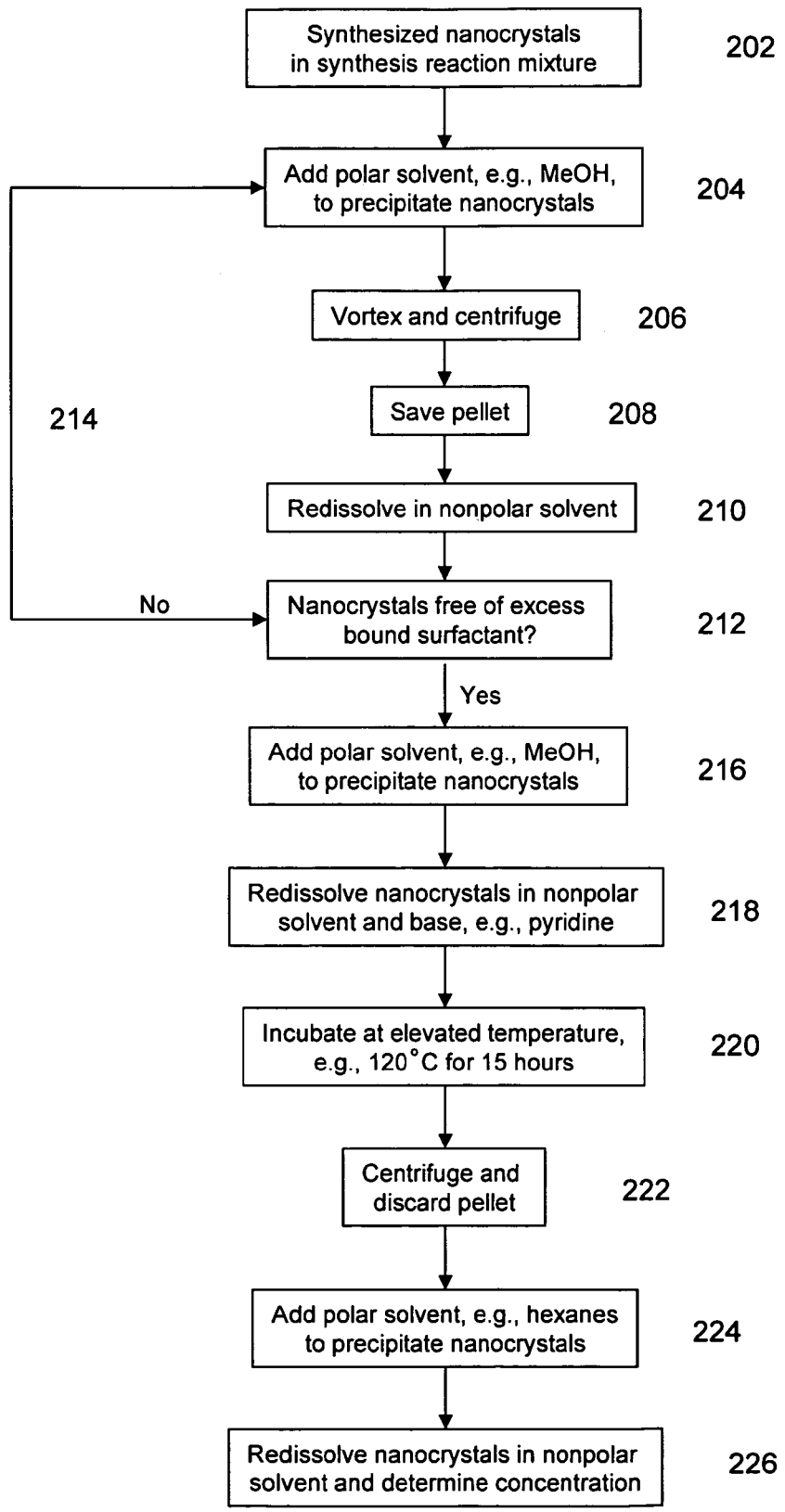
FIG. 2 is a flow chart that schematically illustrates example post synthetic processing steps for nanocrystal preparation in accordance with the invention.

In accordance with certain aspects of the present invention, following the growth or synthesis process, the nanocrystals are harvested and cleaned by an iterative process of precipitation, resolubilization and precipitation, until a desired level of purity is obtained. FIG. 2 provides a flow chart that schematically illustrates exemplary processes of the invention. In particular, the population of nanocrystals is first disposed in a solvent mixture in which both the nanocrystals and the contaminating surfactant or surfactants are soluble, e.g., as derived from the synthesis of the nanocrystals (see FIG. 1). The solvent mixture is then altered such that the nanocrystals are no longer soluble in the resulting solvent mixture, and the precipitated nanocrystals are recovered. The recovered nanocrystals are then resolubilized and re-precipitated a number of times to achieve the desired level of purity.

1. Dual Solvent Method

In a first embodiment, the washing of the nanocrystal populations is carried out using a mixed solvent process that employs a solvent mixture that includes at least two different solvents of differing polarity whereby the nanocrystals are soluble in a sufficient concentration of a nonpolar or less polar first solvent and the surfactant portion is soluble in a sufficient concentration of the more polar second solvent. In the first or solubilizing solvent mixture, both the more polar and less polar solvents are present at such permissive concentrations, e.g., both crystals and surfactants are soluble in the first mixture. Typically, the nanocrystal portion of the mixture is then precipitated from the solvent mixture by elevating the concentration of the second or more polar solvent (or lowering the concentration of first or less polar solvent) to the point at which the nanocrystals are no longer soluble. As will be appreciated by those skilled in the art, the inverse treatment may also be used where the nanocrystals have a large enough level of solubilizing surfactant associated with them, e.g., making them more soluble in more polar solvents, which then might dictate precipitation by increasing the concentration of less polar solvent in the mixture.

The precipitated nanocrystals are then separated from the solvent mixture by, e.g., centrifugation, filtering or the like, and resuspended in an additional quantity of the solvent mixture in which the nanocrystals and surfactant are again both soluble. This process is optionally repeated to yield a desired level of purity. Such repeated processing may be carried out a selected number of iterations, e.g., as are known to yield the desired purity. Alternatively, and in certain preferred aspects, the dissolved nanocrystals are then typically checked for purity, e.g., to determine whether the surfactant level in the composition is sufficiently low. The precipitation and re-dissolution steps are then optionally repeated as necessary until the amount of free surfactant in the nanocrystal mixture is less than 10% or less than 5% of the total surfactant concentration (free and bound), preferably less than 1%, and more preferably less than 0.1% of the total amount of surfactant.

The solvents used in the solubilizing and precipitation solvent mixtures as well as their relative concentrations in each mixture will typically vary depending upon the nature of the nanocrystals and the organic contaminant that is sought to be removed, e.g., the type of surfactants present. In general, however, the inorganic nanocrystal populations are generally soluble in relatively less polar solvents, such as toluene, benzene or hexanes (a mixture of branched and unbranched six carbon alkanes), and the like, as well as chloroform, which while generally polar, is relatively less polar than, e.g., methanol, and in which nanocrystals are soluble. Conversely, organic materials, and particularly more polar organic materials, i.e., surfactants, typically favor more polar environments for solubility, such as relatively low molecular weight alcohols, e.g., methanol and ethanol, and in cases of certain preferred surfactants, alcohols that have greater than two carbon atoms, e.g., isopropanol, butanol, or the like. As a result, in accordance with certain aspects of the invention, the less polar solvent portion of the solvent mixtures will typically include a less polar solvent such as chloroform, toluene, hexanes, benzene or the like, and a more polar solvent portion such as methanol, ethanol, isopropanol, butanol, ethyl acetate, acetone, or the like.

The relative concentrations of the less polar to more polar solvents in the solubilizing solvent mixture will typically range from about 10:1 to about 3:1 with particularly preferred ratios being approximately 4:1. In precipitating the nanocrystals out of the solubilizing solvent mixture, one will typically alter this ratio to between about 2:1 and about 1:2. Alteration of the ratio is typically accomplished by raising the concentration of the more polar solvent, e.g., by addition of more polar solvent to the mixture, but is also optionally done by lowering the concentration of less polar solvent, e.g., through evaporation etc. As noted, precipitation is optionally nanocrystal size-selective.

Once the nanocrystals are precipitated, they are typically separated from the liquid portion of the suspension by any of a number of means, including centrifugation, filtration, or the like. The separated nanocrystals are then re-dissolved in the first solvent mixture (solubilizing solvent mixture), and the precipitation and separation steps are repeated until the desired purity is achieved. In accordance with the present invention, this typically means at least 3 cycles of precipitation and redissolution from the synthesis mixture, preferably 4 or more cycles, in some cases 5 or more or even 6 or more cycles of precipitation and redissolution from the synthesis reaction mixture.

The level of free surfactant in the nanocrystal containing solution may be checked after any or all of the iterative washing cycles to confirm the purity of the solution. Checking may generally be carried out by any method that provides the information required, including but not limited to $^{31}P$ NMR. Such checking can be used as the basis for continuing or stopping iterative washing steps, or can be used to set a baseline level of washing steps necessary to determine how many steps are needed to reach the desired purity.

Once the nanocrystals have reached the desired level of purity, either by having been iteratively precipitated and redissolved a prescribed number of times or by having been analyzed to determine purity, they are optionally then subjected to additional processing steps, e.g., as described in greater detail below (see, e.g., the section entitled "Reduction of Bound Surfactant").

2. Single Solvent Exchange Method

In an alternative process, a near complete solvent exchange process is used to reduce the level of free surfactant in the nanocrystal preparations. This process is schematically illustrated in the flow chart shown in FIG. 2. In particular, rather than using a dual solvent mixture, the nanocrystals are precipitated out of the initial reaction mixture in which they were synthesized (202) using a more polar solvent such as a low molecular weight alcohol, e.g., methanol, etc. (step 204). Precipitation is, as above, generally achieved by adding the polar component at a ratio of between about 2:1 and 1:2 reaction mixture to more polar solvent, until the nanocrystals precipitate from the solution. As noted previously, by selectively precipitating the mixture, one can also perform some level of size selection of the nanocrystals from the initial mixture, as nanocrystals tend to precipitate out of the reaction solution in a size dependent manner. Once the desired nanocrystals have been precipitated from the solution, the nanocrystals are separated from the liquid by, e.g., by centrifugation and decanting, by filtration, etc. (See, e.g., steps 206 and 208). The nanocrystals are then redissolved in a less polar solvent, e.g., toluene, chloroform etc. (step 210) (or a mixed solvent, as was previously described).

The precipitation and redissolution steps are then repeated (step 214) as necessary to yield the desired level of purity with respect to free surfactant (212). Precipitation is, as above, generally achieved by adding the more polar component at a ratio of between about 2:1 and 1:2 less polar to more polar solvent, until the nanocrystals precipitate from the solution. As with the dual solvent method described above, the cycle of precipitation and redissolving is typically carried out at least 3 times from the initial reaction mixture, preferably 4 or more times, in some cases 5 or more times, and in some cases 6 or more times. Also as described above, what is of most interest is not necessarily the number of iterative precipitation steps used, but the resultant level of surfactant following the last precipitation step. As noted previously, the free surfactant remaining in the nanocrystal containing solution following the iterative washing processes is typically less than 10% of the overall amount of surfactant present (free and bound), preferably less than 5%, more preferably less than 1%, and still more preferably less than 0.1%. As used herein, the percentages of remaining surfactant are generally determined using NMR, e.g., $^{31}$P-NMR. The percentages described herein, for example, represent amounts detected using such a system when analyzing 100 mg of nanocrystals in 0.75 ml toluene, which yields no detectable free surfactant peak in the phosphorous NMR after 1100 scans. Running a greater number of scans may result in detection of contaminating surfactant, but that level would be expected to be below the percentages described herein. FIG. 3A-G provides plots of free and bound surfactant in a nanocrystal preparation following each of a number of iterative washing steps. As shown, the level of free surfactant in the solution drops considerably after each wash, and is virtually undetectable following the fourth wash step (FIG. 3D-3G).

Subsequent precipitation steps typically add more polar solvent at the ratios described previously, e.g., between 2:1 and 1:2 less polar to more polar solvent. This may be at the same level as used in the first precipitation step, or alternatively, it may be at a level greater than used in the first step. In particular, as noted above, the first precipitation step may also be used as a size selection process necessitating closer control over the added more polar solvent, e.g., to precipitate some, but not all nanocrystals in solution. Subsequent precipitation steps, on the other hand, are focused on recovering most if not all of the nanocrystals, rather than on such size selection. Accordingly, in many instances, the amount of more polar solvent added in such subsequent precipitation steps will be higher than in the initial precipitation.

Once the nanocrystals have reached the desired level of purity, either by having been iteratively precipitated and redissolved a prescribed number of times or by having been analyzed to determine purity, they are optionally then subjected to additional processing steps, e.g., as described in greater detail below (see, e.g., the section entitled "Reduction of Bound Surfactant").

3. Liquid-Liquid Extraction Method

In another alternative process, a liquid-liquid phase separation process is used to reduce the level of free surfactant in the nanocrystal populations. In the methods, the nanocrystals are combined with a first solvent in which the nanocrystals are soluble and a second solvent in which the nanocrystals are less soluble (e.g., insoluble). The first and second solvents are permitted to form a first liquid phase comprising the first solvent and the nanocrystals and a second liquid phase comprising the second solvent, and the phases are then separated (e.g., one phase is pipetted, decanted, etc. away from the other). Since the surfactant is typically soluble in both the first and second solvents (and is preferably more soluble in the second solvent than are the nanocrystals, and more preferably is also itself more soluble in the second solvent than in the first), this process results in a reduction in the amount of free surfactant in solution with the nanocrystals.

This process is optionally repeated to yield a desired level of purity. Such repeated processing may be carried out a selected number of iterations, e.g., as are known to yield the desired purity. For example, the steps can be repeated two or more, three or more, four or more, five or more, or even six or more times. In certain preferred aspects, the dissolved nanocrystals are typically checked for purity, e.g., to determine whether the surfactant level in the composition is sufficiently low. The combination, phase formation, and separation steps are then optionally repeated as necessary until the amount of free surfactant in the nanocrystal mixture is less than 10% or less than 5% of the total surfactant concentration (free and bound), preferably less than 1%, and more preferably less than 0.1% of the total amount of surfactant.

To repeat the cycle, either fresh second solvent can be combined with the first liquid phase containing the first solvent and the nanocrystals, or the nanocrystals can be separated from the first liquid phase (e.g., by centrifugation, filtration, precipitation, or the like), redissolved in fresh first solvent, and combined with fresh second solvent, as desired.

The first and second solvents, as well as their relative ratios, will typically vary depending upon the nature of the nanocrystals and the organic contaminant that is sought to be removed, e.g., the type of surfactant(s) present. Typically, for cleaning of inorganic nanocrystals, the first solvent will be less polar than the second solvent.

In one example embodiment, nanocrystals (e.g., Pd or InP) prepared with TOP as the surfactant (or one of the surfactants) are processed by liquid-liquid extraction with toluene as the first solvent and methanol as the second solvent. It is worth noting that the first and second solvents need only be immiscible under the conditions used, e.g., in the presence of the surfactant(s) to be removed. For example, although toluene and methanol mix and do not form separable phases in the presence of TOPO, they do form two liquid phases that do not mix in the presence of TOP and can thus be used in a liquid-liquid extraction to remove this surfactant.

It is worth noting that the liquid-liquid phase separation process is optionally used in combination with the liquid-solid extraction steps also described herein (e.g., the washing methods described in the sections entitled "Dual Solvent Method" and "Single Solvent Exchange Method"). For example, the nanocrystals can be processed by at least one cycle of liquid-liquid extraction and at least one cycle of precipitation and redissolution, in any order.

Once the nanocrystals have reached the desired level of purity, either by having been iteratively extracted a prescribed number of times or by having been analyzed to determine purity, they are optionally then subjected to additional processing steps, e.g., as described in greater detail below (see, e.g., the following section, entitled "Reduction of Bound Surfactant").

C. Reduction of Bound Surfactant

Once the excess free surfactant is removed from the nanocrystals, e.g., following the last precipitation and separation step, the resulting nanocrystals may then be further processed to reduce the level of bound surfactant on the surfaces of the nanocrystals. In general, the removal of bound surfactant is carried out by titrating the bound surfactant away from the surface of the nanocrystals. Because the surfactants used in crystal synthesis and processing comprise organic acids, they may generally be titrated away from the surface using an appropriate organic base that is miscible in the organic solvent containing the nanocrystals. Examples of bases that are particularly suitable for complexing with the surfactants include those which form insoluble salts with the surfactants, thus precipitating away from the solution and out of the chemical equilibrium equation. Some particularly useful organic bases include, e.g., pyridine, aniline, bypyridine, piperidine, imidazole, diethylamine, triethylamine, di-isopropylamine, and other alkyl amines, and the like. In particularly preferred aspects, pyridine is used as the base as it readily titrates the acid groups on the preferred surfactants, e.g., ODPA, HDPA, etc., to yield salts that are insoluble in the solvent that contains the nanocrystals, e.g., the less polar component, e.g., toluene.

In terms of process, the nanocrystals that have been purified away from excess free surfactant are once again precipitated (step 216), and then redissolved in a combination of less polar solvent and a base, e.g., pyridine (step 218) and optionally incubated at elevated temperature (step 220).

Typically, the base is added in excess to efficiently titrate crystal surface bound surfactant. In general, such excess means base added to the nanocrystal containing solution at a volume ratio of greater than 1:1, more typically 2:1 or greater, and in some cases at a ratio of 3:1 or greater.

Following titration of the excess surface bound surfactant, the insoluble portion is typically removed by centrifugation (step 222). The nanocrystals, now in a mixed solvent, e.g., toluene/pyridine, are then precipitated away from the pyridine by adding additional solvent, e.g., methanol or hexanes (step 224). The precipitated crystals are then separated from the solvent and re-suspended in another, e.g., less polar solvent, e.g., toluene, (step 226) and subjected to analysis for concentration and/or purity. The separation of precipitated surfactant salts from the soluble nanocrystals is a substantial departure from the published synthetic schemes which simply precipitated the nanocrystals and any salts together for subsequent washing, thus preventing adequate separation of these materials.

As noted previously, it is generally desirable, in accordance with the invention, to provide only enough surfactant bound to the surface of the nanocrystal as is necessary for the solubility and dispersability of the nanocrystals in their ultimate matrix or solution. Also as noted previously, it is generally believed that such level includes more than a partial monolayer of surfactant over the surface of the nanocrystal, but not more than about two layers of surfactant, e.g., a bilayer. Determination of the amount of surfactant associated with the nanocrystal is generally carried out by the methods described above, e.g., $^{31}$P-NMR. In the context of $^{31}$P-NMR, a suitable level of bound surfactant yields a NMR spectrum that shows a single broad peak or hump or a single major hump with a slight shoulder (likely indicating a partial bilayer; see FIG. 3D-3G).

IV. Compositions

Nanocrystals processed by any of the methods described herein (e.g., nanocrystals lacking excess free and/or bound surfactant) form another feature of the invention, as do compositions, systems, and devices including such processed nanocrystals.

For example, one class of embodiments provides a composition including a population of nanocrystals dissolved in a first solvent. The nanocrystals are associated with a total amount of surfactant, which includes an amount of bound surfactant and an amount of free surfactant in solution. The amount of free surfactant is less than about 5%, preferably less than about 1%, less than about 0.5%, and more preferably less than about 0.1% of the total amount of surfactant. As noted previously, the nanocrystals can be of essentially any shape, size, and/or composition.

A related class of embodiments provides a composition comprising a population of nanocrystals having a surfactant bound thereto dissolved in a first solvent. The nanocrystals comprise less than a bilayer of surfactant associated therewith. Preferably, the nanocrystals comprise about a monolayer or less of surfactant associated therewith. As noted previously, the amount of surfactant bound to the nanocrystals is greater than zero, since the presence of some surfactant is required for solubility and/or dispersability of the nanocrystals.

Another related class of embodiments provides a composition including a population of nanocrystals and a surfactant bound thereto, wherein the surfactant comprises less than a bilayer. For example, the surfactant preferably comprises about a monolayer or less.

As noted, nanocrystals processed by the methods of the invention are optionally incorporated into various compositions and devices. Thus, the invention provides compositions including nanocrystals processed by the methods of the invention disposed in a matrix (e.g., an organic, inorganic, polymeric, non-polymeric, conductive, semi-conductive, and/or non-conductive matrix). Thus, one example class of embodiments provides a composite that comprises an organic polymer matrix and a population of nanocrystals disposed within the organic polymer matrix. The nanocrystals have a surfactant associated therewith, the surfactant comprising less than a bilayer (e.g., the surfactant can comprise about a monolayer or less).

A wide variety of suitable matrices, e.g., organic polymers, are known in the art. Example matrix materials include, but are not limited to, an inorganic polymer (e.g., a polysiloxane, a polycarbonessiloxane (a copolymer of siloxane and carborane), or a polyphosphazene), an organometallic polymer (e.g., a ferrocene polymer, a platinum polymer, or a palladium polymer), a small molecule (e.g., N,N'-diphenyl-N,N'-bis(3-methylphenyl)-(1,1'biphenyl)-4,4'-diamine) (TPD), (3-(4-biphenyl)-4-phenyl-5-tert-butylphenyl-1,2,4-triazole) (TAZ), tris-(8-hydroxyquinoline) aluminum ($Alq_3$), benzoic acid, phthalic acid, benzoin, hydroxyphenol, nitrophenol, chlorophenol, chloroaniline, or chlorobenzoamide), or an organic polymer (for example, poly(m-phenylene isophthalamide), poly(p-benzamide), a poly(alkyl isonitrile), a polyisocyanate, a thermoplastic polymer (e.g., a polyolefin, a polyester, a polysilicone, a polyacrylonitrile resin, a polystyrene resin, polyvinyl chloride, polyvinylidene chloride, polyvinyl acetate, or a fluoroplastic), a thermosetting polymer (e.g., a phenolic resin, a urea resin, a melamine resin, an epoxy resin, a polyurethane resin, an engineering plastic, a polyamide, a polyacrylate resin, a polyketone, a polyimide, a polysulfone, a polycarbonate, or a polyacetal), a liquid crystal polymer, including a main chain liquid crystal polymer (e.g., poly (hydroxynapthoic acid) or a side chain liquid crystal polymer (e.g., poly <n-((4'(4"-cyanphenyl)phenoxy)alkyl)vinyl ether>), or a conducting polymer (e.g., poly(3-hexylthiophene) (P3HT), poly[2-methoxy, 5-(2'-ethyl-hexyloxy)-p-phenylene-vinylene] (MEH-PPV), poly(phenylene vinylene) (PPV), polyfluorene, or polyaniline). See, e.g., U.S. Pat. No. 7,068,898 and U.S. patent application Ser. No. 10/778,009; Demus et al. (1998) *Handbook of Liquid Crystals: Four Volume Set*, John Wiley and Sons, Inc.; Johannes Brandrup (1999) *Polymer Handbook*, John Wiley and Sons, Inc.; Charles A. Harper (2002) Handbook of Plastics, Elastomers, and Composites, $4^{th}$ edition, McGraw-Hill; T. A. Skatherin, ed. (1986) *Handbook of Conducting Polymers I*, Marcel Dekker, New York; and Skotheim et al. (1998) *Handbook of Conducting Polymers, 2nd Ed.* Marcel Dekker: New York; and Ronald Archer (2001) *Inorganic and Organometallic Polymers*, Wiley-VCH for other examples.

As noted, such compositions can be used in photovoltaic devices, LEDs, and other devices. See, e.g., U.S. Pat. No. 7,068,898 and U.S. patent application Ser. No. 10/778,009.

Another class of embodiments provides a composition comprising a first population of nanocrystals and a second population of nanocrystals. The first population of nanocrystals has a surfactant associated therewith, the surfactant comprising less than a bilayer (e.g., about a monolayer or less). The second population of nanocrystals has a composition different from the first population of nanocrystals, and is interspersed with the first population in the composition. The second population optionally also comprises less than a bilayer of the same or different surfactant.

The interspersed first and second nanocrystal populations can, but need not be, disposed within a matrix, e.g., an organic polymer matrix, an inorganic matrix, a small molecule matrix, or the like. A wide variety of suitable matrix materials are known in the art. See, e.g., the references above for examples. As noted, such compositions can be used in photovoltaic and other devices; see, e.g., U.S. patent application Ser. No. 10/778,009.

V. Examples

The following sets forth a series of experiments that demonstrate processing of nanocrystals according to the methods described herein. It is understood that the examples and embodiments described herein are for illustrative purposes only and that various modifications or changes in light thereof will be suggested to persons skilled in the art and are to be included within the spirit and purview of this application and scope of the appended claims. Accordingly, the following examples are offered to illustrate, but not to limit, the claimed invention.

Example 1

High purity nanocrystals were synthesized according to the following procedure. Due to high variability from manufacturer to manufacturer, surfactants for use in the synthesis process, e.g., HPA, TOPO and TDPA, were first checked for purity using standard NMR. If found to be less than 90% pure, the surfactants were purified by washing with $CHCl_3$, dissolution and recrystallization using $CHCl_3$ and hexanes until the desired purity was achieved. Once sufficiently pure reagents were available, the surfactants TOPO (3.54 g), TDPA (0.33 g) and HPA (0.13 g) were heated to 120° C., at which time the cadmium precursor ($Cd(Me)_2$, 0.5 g of stock solution including 32% $Cd(Me)_2$ by weight in TBP) was added to the mixture. The mixture was then heated to 360° C. and 2.5 g of the second precursor stock solution (e.g., Se:TBP (7.78% by weight)) was added, which dropped the reaction temperature to between 290° and 300° C. Crystals were then allowed to grow at this temperature for 5 minutes. The reaction mixture was then cooled to 60-70° C. to stop crystal growth. Four ml of toluene was added to the cooled mixture which was then split into two equal volume vials which were transferred to a controlled atmosphere glove box. Each vial then received 2 ml of methanol to precipitate out the nanocrystals, and the vials were vortexed and centrifuged at ~3000 rpm. The supernatant was decanted away and the pellet was redissolved in 1 ml of toluene and vortexed. One ml of methanol was then added to the nanocrystals to precipitate them again, and the vials were vortexed and centrifuged again. This process was repeated another 4 times with a $^{31}$P-NMR analysis being performed after each wash (See FIGS. 3A-3G). NMR was performed on a Bruker 400 MHz NMR using P31 probe at 162 MHz (proton decoupled P31 NMR, e.g., 1100 scans on 100 mg of nanocrystals in 0.75 ml D8 toluene).

Following the last wash step, the pellet was dissolved in 0.5 ml of toluene and 1 ml of pyridine was added to titrate excess bound surfactant. The mixture was vortexed and then heated to 150° C. for 17 hours. The heated mixture was then cooled to room temperature, vortexed and then centrifuged at ~3000 rpm to remove the precipitated salts. The supernatant containing the nanocrystals was decanted off of the pellet and again, each vial was split into two separate vials. Each vial then received 7.5 ml hexanes which precipitated out the nanocrystals. The mixture was vortexed and centrifuged at ~3000 rpm. The supernatant was decanted away from the pellet which was then redissolved in toluene, and analyzed for the concentration of nanocrystals.

Example 2

Excess organic surfactants such as trioctyl phosphine (TOP), trioctyl phosphine oxide (TOPO), hexadecyl phosphonic acid (HDPA), octadecyl phosphonic acid (ODPA), and tri-n-butyl phosphine (TBP) are commonly present in nanostructure preparations as prepared by standard techniques cited herein or in U.S. patent application Ser. No. 10/656,802, now U.S. Pat. No. 6,878,871. Optionally, any excess organic surfactant is removed from the nanostructure preparation prior to use of the nanostructures, for example, prior to their association with the conductive compositions described in U.S. patent application Ser. No. 10/656,802.

This can be achieved, for example, by adding a solvent mixture prepared from a first solvent in which a nanostructure is soluble (e.g., toluene or chloroform) and a second solvent in which the nanostructure is not soluble (e.g., isopropanol or longer chain alcohol, or an acetate such as ethyl acetate). While the ratio of first solvent to second solvent as prepared in the solvent mixture typically ranges between 1:1 and 10:1, one preferred solvent mixture is 4 parts toluene to one part isopropanol.

An additional quantity of the second solvent is then added in a quantity sufficient to precipitate the nanostructures (but not the excess surfactants) from the solvent mixture. The precipitated nanostructures are then separated from the solvent mixture (e.g., by centrifuging), thereby removing excess organic surfactant from the nanostructures. Optionally, the precipitated nanostructures can be washed with the solvent mixture one or more additional times, e.g., if analysis determines that the nanostructure preparation still contains an undesirable quantity of excess surfactant.

Additionally, any excess organic salts can be removed from the nanocrystal reaction mixture by performing a pyridine exchange on the nanocrystals in the nanocrystal reaction mixture, and precipitating the organic salts while leaving the nanocrystals in solution. The pyridine exchange is performed, for example, by heating the nanocrystal reaction mixture to 150° C. for about 1 hour.

Example 3

This example describes fabrication of a photovoltaic device comprising two intermixed populations of processed nanocrystals, CdSe nanocrystals and CdTe nanocrystals. See U.S. patent application Ser. No. 10/656,910.

Substrate Cleaning

Substrates (e.g., ITO on glass, from Thin Film Devices, Inc., www.tfdinc.com) are cleaned, e.g., using the following procedure. Substrates are wiped with isopropanol, ultrasonicated in isopropanol, ultrasonicated in 2% Hellmanex™ deionized water, rinsed very thoroughly under flowing deionized water, ultrasonicated in deionized water, ultrasonicated in semiconductor grade acetone, and ultrasonicated in semiconductor grade isopropanol. Each sonication is for 15 minutes. The substrates are then oxygen plasma cleaned, at 200 W (1% reflected power) for 10 minutes with oxygen introduced at a pressure of approximately 400 mTorr into a vacuum of 80 mTorr.

PEDOT Layer Processing

PEDOT/PSS Poly(3,4-ethylenedioxythiophene) poly(styrenesulfonate) (e.g., Baytron® P VP AI 4083 from H. C. Starck) is filtered through a 0.2 μm pore size cellulose acetate filter. PEDOT is spin coated onto the substrates at 3000 rpm for 60 seconds. The PEDOT layer is then cured by baking the spincoated substrate on a hotplate at 120° C. for 60 minutes under atmospheric conditions.

Preparation of Cdse:Cdte Bicrystal Blend Solution

The CdSe:CdTe bicrystal blend solution is prepared in a glove-box with an argon atmosphere. CdTe nanocrystals are washed by dissolving them in toluene and precipitating them with isopropanol 3 times; CdSe nanocrystals are washed by dissolving them in toluene and precipitating them with methanol 3 times. For surface treatment, both CdSe and CdTe nanocrystals are stirred in a solution of toluene and phenylphosphonic acid (PPA) at 110° C. for 20 hours. (The surface treatment step may not be necessary and could be omitted, or a different nanocrystal cleaning procedure, e.g., using pyridine, followed by treatment with PPA or another ligand may be substituted for this step.) After precipitation with isopropanol, the nanocrystals are dissolved in toluene, e.g., at a concentration of 95 mg/ml (for CdTe) and 110 mg/ml (for CdSe), respectively. The CdTe:toluene solution and the CdSe:toluene solution are combined into a 1.5 ml glass vial, such that the ratio of CdTe:CdSe is 50:50 by weight, and the concentration of nanocrystals in the final solution is between about 80-100 mg/ml. For example, if the concentration of CdTe in toluene is 95 mg/ml and the CdSe in toluene is 110 mg/ml, 500 ul of CdTe nanocrystal solution and 432 ul CdSe nanocrystal solution are mixed, such that the resulting ratio of CdTe:CdSe is 50:50 and the resulting concentration of nanocrystals is 102 mg/ml. The solution is vortexed for 2 minutes, heated at 56° C. for 10 minutes, and ultrasonicated for 15 minutes. After the solution is transferred to a microcentrifuge vial, it is centrifuged for 2 minutes at 11,000 rpm in a microcentrifuge.

Spincoating of CdSe:CdTe Nanocrystal Blend Solution

The CdTe:CdSe solution is spincoated onto the ITO/PEDOT:PSS substrates (in the glove box). Typically, 120 μl of solution is used for each substrate, with a spin speed of 950 rpm for 40 seconds. Any solution on the back side of the substrates is removed by wiping with chloroform.

Evaporation of Aluminum Cathodes

The nanocrystal-PEDOT-coated substrates are transferred without exposure to oxygen into an evaporator. Aluminum (purity 99.999%) is evaporated onto them at a rate of 5 A/s under a vacuum of less than $1\times10^{-7}$ torr to a thickness of approximately 200 nm.

Silver Paste

Any nanocrystal and/or PEDOT film on top of the ITO electrode contact pins is removed. Silver paste is applied to establish electrical connection to the ITO pins. The resulting devices are then characterized as desired.

Although described in some detail for purposes of understanding, the scope of the claimed invention is not limited to the disclosure and is only limited by the claims appended hereto or to any related patent or application, including without limitation any continuation, in whole or in part, divisional, reissue, reexamination, etc. It will be clear to one skilled in the art from a reading of this disclosure that various changes in form and detail can be made without departing from the true scope of the invention. For example, all the techniques and compositions described above can be used in various combinations. All publications, patents, patent applications, and/or other documents cited in this application are incorporated by reference in their entirety for all purposes to the same extent as if each individual publication, patent, patent application, and/or other document were individually indicated to be incorporated by reference for all purposes.

What is claimed is:

1. A method of processing nanocrystals, comprising:
   providing the nanocrystals in a first solvent in which the nanocrystals are soluble, the nanocrystals having a total amount of surfactant associated therewith, the total amount of surfactant including an amount of free surfactant and an amount of nanocrystal bound surfactant;
   precipitating the nanocrystals by adding a second solvent of higher polarity to the first solvent to provide a precipitating solvent mixture in which the nanocrystals are insoluble, to provide precipitated nanocrystals;
   separating the precipitated nanocrystals from the precipitating solvent mixture; and
   redissolving the nanocrystals by adding a third solvent in which the nanocrystals are soluble to the precipitated nanocrystals.

2. The method of claim 1, further comprising the step of repeating the precipitating, separating and redissolving steps until the amount of free surfactant associated with the nanocrystals is less than 1% of the total amount of surfactant associated with the nanocrystals.

3. The method of claim 2, wherein the nanocrystals are checked following at least one of the redissolving steps to determine the amount of free surfactant remaining associated with the nanocrystals.

4. The method of claim 1, wherein the steps of precipitating, separating and redissolving are repeated 3 or more times.

5. The method of claim 1, wherein the steps of precipitating, separating and redissolving are repeated 4 or more times.

6. The method of claim 1, wherein the steps of precipitating, separating and redissolving are repeated 5 or more times.

7. The method of claim 1, wherein the steps of precipitating, separating and redissolving are repeated 6 or more times.

8. The method of claim 1, wherein the first solvent comprises a mixture of a polar and a less polar solvent.

9. The method of claim 8, wherein the polar solvent is an alcohol having at least two carbon atoms.

10. The method of claim 9, wherein the alcohol having at least two carbon atoms comprises ethanol, isopropanol or butanol.

11. The method of claim 8, wherein the polar solvent is selected from the group consisting of: an alcohol, methanol, an acetate, ethyl acetate, a ketone, and acetone.

12. The method of claim 8, wherein the less polar solvent is selected from the group consisting of: chloroform and toluene.

13. The method of claim 8, wherein the less polar solvent is selected from the group consisting of: an alkane, hexanes, and benzene.

14. The method of claim 8, wherein a ratio of less polar solvent to polar solvent in the first solvent is greater than 3:1.

15. The method of claim 8, wherein a ratio of less polar solvent to polar solvent in the first solvent is greater than 4:1.

16. The method of claim 8, wherein a ratio of less polar solvent to more polar solvent in the precipitating solvent mixture is 2:1 or less.

17. The method of claim 8, wherein a ratio of less polar solvent to more polar solvent in the precipitating solvent mixture is 1:1 or less.

18. The method of claim 1, wherein a ratio of the first solvent to the second solvent in the precipitating solvent mixture is 2:1 or less.

19. The method of claim 1, wherein a ratio of the first solvent to the second solvent in the precipitating solvent mixture is 1:1 or less.

20. The method of claim 1, wherein the third solvent is identical to the first solvent.

21. The method of claim 1, wherein the first solvent is selected from the group consisting of: chloroform, toluene, an alkane, hexanes, and benzene.

22. The method of claim 1, wherein the second solvent is selected from the group consisting of: an alcohol having at least two carbon atoms, ethanol, isopropanol, and butanol.

23. The method of claim 1, wherein the second solvent is selected from the group consisting of: an alcohol, methanol, an acetate, ethyl acetate, a ketone, and acetone.

24. A method of processing nanocrystals, comprising:
    a) providing the nanocrystals in a first mixture in which the nanocrystals are soluble, the first mixture comprising one or more of: a first solvent or a reaction mixture;
    b) precipitating the nanocrystals by adding a second solvent to the first mixture to provide a second mixture in which the nanocrystals are insoluble, to provide precipitated nanocrystals;
    c) separating the precipitated nanocrystals from the second mixture;
    d) redissolving the nanocrystals by adding at least the first solvent to the precipitated nanocrystals, to provide a third mixture;
    e) adjusting the polarity of the third mixture to provide a fourth mixture in which the nanocrystals are insoluble, to provide precipitated nanocrystals;
    f) separating the precipitated nanocrystals from the fourth mixture; and
    g) repeating steps d, e and/or f until, when the nanocrystals are redissolved in the first solvent, an amount of free surfactant is less than 5% an amount of total surfactant, the amount of total surfactant comprising the amount of free surfactant and an amount of nanocrystal bound surfactant.

25. The method of claim 24, wherein steps d, e and/or f are repeated until, when the nanocrystals are redissolved in the first solvent, the amount of free surfactant is less than 1% the amount of total surfactant.

26. The method of claim 24, wherein steps d, e and f are repeated two or more times, three or more times, four or more times, five or more times, or six or more times.

27. The method of claim 24, wherein the nanocrystals are checked following at least one of the redissolving steps to determine the amount of free surfactant.

28. The method of claim 24, wherein the first mixture comprises the first solvent and the second solvent.

29. The method of claim 24, wherein redissolving the nanocrystals by adding at least the first solvent to the precipitated nanocrystals to provide the third mixture comprises adding the first solvent and the second solvent to the precipitated nanocrystals to provide the third mixture.

30. The method of claim 24, wherein adjusting the polarity of the third mixture comprises adding the second solvent to the third mixture.

31. The method of claim 24, wherein the first solvent is less polar than the second solvent.

32. The method of claim 31, wherein the first solvent is selected from the group consisting of: chloroform, toluene, an alkane, hexanes, and benzene.

33. The method of claim 31, wherein the second solvent is selected from the group consisting of: an alcohol, methanol, ethanol, an alcohol having at least two carbon atoms, isopropanol, butanol, an acetate, ethyl acetate, a ketone, and acetone.

34. A method of processing nanocrystals, comprising:
    adding a solvent mixture to the nanostructures, the solvent mixture comprising a first solvent in which the nanostructures are soluble and a second solvent in which the nanostructures are not soluble;
    precipitating the nanostructures by adding an additional quantity of the second solvent, the additional quantity being sufficient to precipitate the nanostructures from the solvent mixture; and
    separating the nanostructures from the solvent mixture.

35. The method of claim 34, comprising repeating the addition, precipitation and separation steps two or more times.

36. The method of claim 34, comprising analyzing the nanostructures to determine a quantity of surfactant present.

37. The method of claim 34, wherein the first solvent comprises toluene or chloroform.

38. The method of claim 34, wherein the second solvent comprises isopropanol, an alcohol comprising more than two carbon atoms, an acetate, or ethyl acetate.

39. The method of claim 34, wherein the solvent mixture added to the nanostructures comprises the first solvent and the second solvent in a ratio between 1:1 and 10:1.

40. The method of claim 34, wherein the solvent mixture added to the nanostructures comprises four parts toluene to one part isopropanol.

41. The method of claim 34, further comprising performing a pyridine exchange and precipitating organic salts while leaving the nanostructures in solution.

42. A method of processing nanocrystals, comprising:
  a) combining the nanocrystals, a first solvent in which the nanocrystals are soluble, and a second solvent in which the nanocrystals are less soluble, the nanocrystals having a total amount of surfactant associated therewith, the total amount of surfactant including an amount of free surfactant and an amount of nanocrystal bound surfactant;
  b) permitting the first and second solvents to form a first liquid phase comprising the first solvent and the nanocrystals and a second liquid phase comprising the second solvent; and
  c) separating the first liquid phase from the second liquid phase.

43. The method of claim 42, comprising repeating steps a, b and c two or more times.

44. The method of claim 42, comprising repeating steps a, b and c until the amount of free surfactant is less than 1% the amount of total surfactant.

45. The method of claim 42, wherein the nanocrystals are checked following at least one separating step to determine the amount of free surfactant.

46. The method of claim 42, wherein the first solvent is less polar than the second solvent.

47. The method of claim 42, wherein the first solvent is toluene, the second solvent is methanol, and the surfactant is TOP.

* * * * *